(12) United States Patent
Ahn et al.

(10) Patent No.: US 6,727,161 B2
(45) Date of Patent: *Apr. 27, 2004

(54) ISOLATION TECHNOLOGY FOR SUBMICRON SEMICONDUCTOR DEVICES

(75) Inventors: Yongchul Ahn, Eagon, MN (US); Kaichiu Wong, Sunnyvale, CA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/505,737

(22) Filed: Feb. 16, 2000

(65) Prior Publication Data

US 2003/0032260 A1 Feb. 13, 2003

(51) Int. Cl.⁷ .................................. H01L 21/76
(52) U.S. Cl. .................. 438/444; 438/439; 438/445; 438/452
(58) Field of Search ................. 438/443, 444, 438/445, 425, 426, 439, 452

(56) References Cited

U.S. PATENT DOCUMENTS

| | | | |
|---|---|---|---|
| 4,764,248 A | 8/1988 | Bhattacherjee et al. | 438/439 |
| 4,842,675 A | 6/1989 | Chapman et al. | 438/425 |
| 4,892,614 A | 1/1990 | Chapman et al. | 438/425 |
| 4,965,221 A * | 10/1990 | Dennison et al. | 438/443 |
| 5,096,848 A | 3/1992 | Kawamura | 438/425 |
| 5,298,451 A | 3/1994 | Rao | 438/447 |
| 5,316,965 A | 5/1994 | Philipossian et al. | 438/424 |
| 5,326,715 A | 7/1994 | Jang et al. | 438/443 |
| 5,374,585 A | 12/1994 | Smith et al. | 438/443 |
| 5,413,953 A | 5/1995 | Chien et al. | 438/443 |
| 5,445,990 A | 8/1995 | Yook et al. | 438/443 |
| 5,472,905 A | 12/1995 | Paek et al. | 438/443 |
| 5,652,177 A | 7/1997 | Pan | 438/443 |
| 5,674,775 A | 10/1997 | Ho et al. | 438/296 |
| 5,683,933 A | 11/1997 | Seino | 438/442 |
| 5,686,346 A | 11/1997 | Duane | 438/439 |
| 5,696,022 A | 12/1997 | Jang | 438/439 |
| 5,705,422 A | 1/1998 | L'Yee | 438/420 |
| 5,731,221 A * | 3/1998 | Kwon | 438/426 |
| 5,731,241 A | 3/1998 | Jang et al. | 438/424 |
| 5,786,262 A | 7/1998 | Jang et al. | 438/424 |
| 5,807,789 A | 9/1998 | Chen et al. | 438/714 |
| 5,811,345 A | 9/1998 | Yu et al. | 438/424 |
| 5,811,347 A | 9/1998 | Gardner et al. | 438/435 |
| 5,824,594 A | 10/1998 | Kim et al. | 438/446 |
| 5,834,360 A | 11/1998 | Tesauro et al. | 438/445 |
| 5,849,625 A | 12/1998 | Hsue et al. | 438/424 |
| 5,849,626 A | 12/1998 | Song | 438/444 |
| 5,851,901 A | 12/1998 | Gardner et al. | 438/439 |
| 5,891,787 A | 4/1999 | Gardner et al. | 438/424 |

(List continued on next page.)

FOREIGN PATENT DOCUMENTS

| | | |
|---|---|---|
| JP | 4-12528 | 1/1992 |
| JP | 5-283519 | 10/1993 |
| JP | 6-104334 | 4/1994 |
| JP | 6-163528 | 6/1994 |

*Primary Examiner*—Amir Zarabian
*Assistant Examiner*—Chirsty Novacek
(74) *Attorney, Agent, or Firm*—Sonnenschein Nath & Rosenthal LLP

(57) ABSTRACT

A process for making a semiconductor structure, includes forming a second dielectric layer on exposed regions of an intermediate structure. The intermediate structure includes: a semiconductor substrate having the regions, a first dielectric layer on at least a first portion of the semiconductor substrate, an etch-stop layer on at least a second portion of the first dielectric layer, and spacers on at least a third portion of said semiconductor substrate. The spacers are adjacent edges of the etch-stop layer and adjacent the exposed regions.

14 Claims, 4 Drawing Sheets

U.S. PATENT DOCUMENTS

| | | | |
|---|---|---|---|
| 5,910,018 A * | 6/1999 | Jang | 438/425 |
| 5,918,131 A | 6/1999 | Hsu et al. | 438/296 |
| 5,920,787 A | 7/1999 | Haskell et al. | 438/425 |
| 5,926,722 A | 7/1999 | Jang et al. | 438/424 |
| 5,937,309 A | 8/1999 | Chuang | 438/424 |
| 5,940,719 A | 8/1999 | Jang et al. | 438/443 |
| 5,945,352 A | 8/1999 | Chen et al. | 438/713 |
| 5,945,724 A | 8/1999 | Parekh et al. | 257/510 |
| 5,972,778 A | 10/1999 | Hamada | 438/444 |
| 5,981,354 A | 11/1999 | Spikes et al. | 438/424 |
| 5,998,278 A | 12/1999 | Yu | 438/424 |
| 5,998,280 A | 12/1999 | Bergemont et al. | 438/425 |
| 6,096,612 A * | 8/2000 | Houston | 438/296 |
| 6,110,798 A * | 8/2000 | Gonzalez et al. | 438/426 |
| 6,153,482 A * | 11/2000 | Su et al. | 438/297 |
| 6,387,777 B1 * | 5/2002 | Hurley | 438/439 |

* cited by examiner

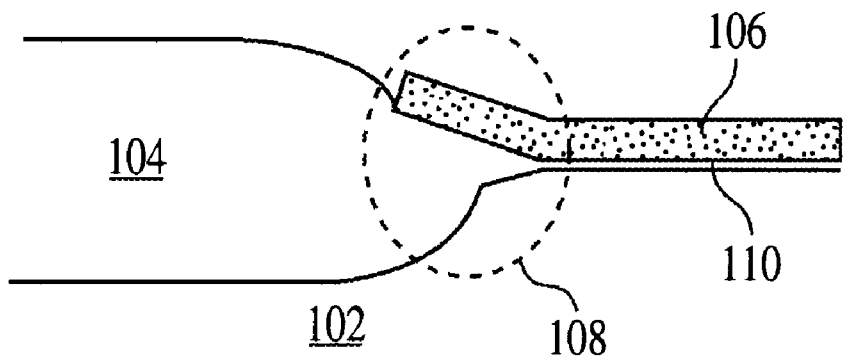
FIG. 1
CONVENTIONAL
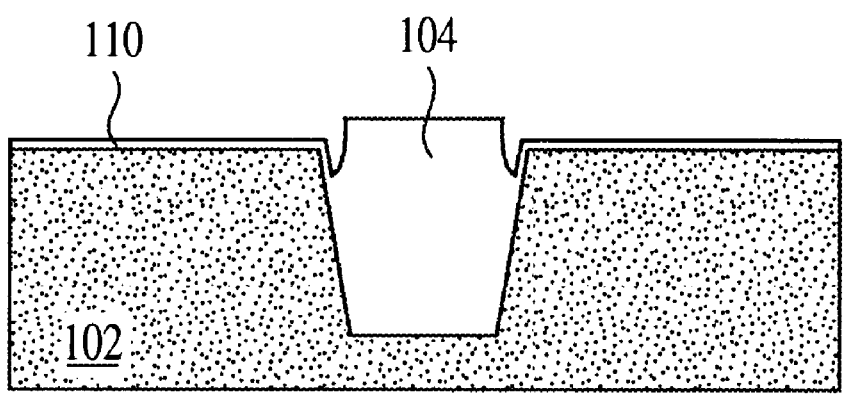
FIG. 2
CONVENTIONAL

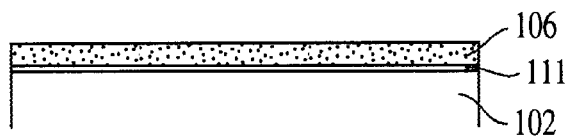
FIG. 3(a)
CONVENTIONAL
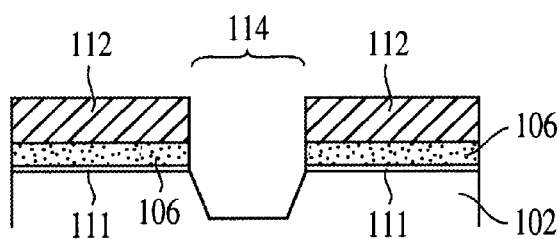
FIG. 3(b)
CONVENTIONAL
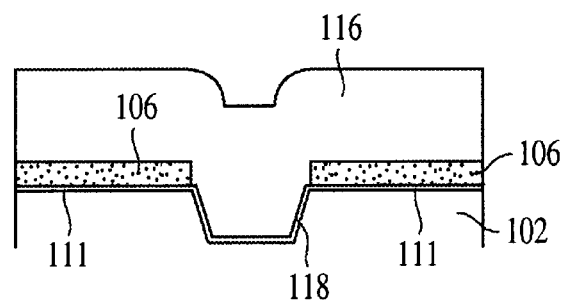
FIG. 3(c)
CONVENTIONAL
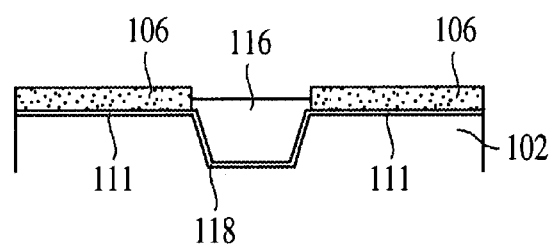
FIG. 3(d)
CONVENTIONAL
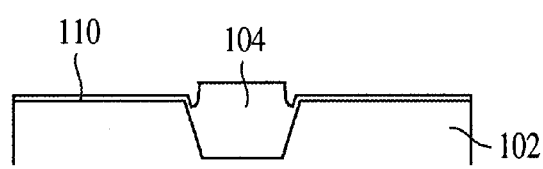
FIG. 3(e)
CONVENTIONAL

ISOLATION TECHNOLOGY FOR SUBMICRON SEMICONDUCTOR DEVICES

BACKGROUND OF THE INVENTION

The present relates to an isolation technology for semiconductor devices.

A variety of methods and structures have been used to isolate areas on semiconductor devices. One conventional technology is based on localized oxidation of silicon (LOCOS), shown in FIG. 1. In FIG. 1, on the silicon substrate 102 is a field oxide 104 that acts to isolate an active area of the semiconductor device; the field oxide is contiguous with the gate oxide 110 on the active region of the silicon substrate. The active area in this illustration includes a layer of silicon nitride 106. The field oxide encroaches on the active area in the shape of a bird's beak 108, before narrowing into the gate oxide. This large encroachment distorts the active region, and interferes with the submicron lithography necessary to construct elements in the active region.

Another widely used isolation technique is silicon trench isolation (STI), shown in FIG. 2. The field oxide 104 does not have the shape of a bird's beak where it narrows into the gate oxide 110 on the silicon substrate 102. FIGS. 3(a)–3(e) illustrate the step used to prepare the structure shown in FIG. 2. In FIG. 3(a) thermal oxidizing forms a thermal oxide layer 111 on the silicon substrate 102, followed by depositing a silicon nitride layer 106 using low pressure chemical vapor deposition (LPCVD). In FIG. 3(b) a photoresist layer 112 is applied, and patterned using a mask. Etching of those portions of the silicon nitride, thermal oxide and silicon substrate not covered by the photoresist layer, in a single operation, opens a trench 114.

In FIG. 3(c) the photoresist layer is first stripped, and the substrate is cleaned. A thin oxide layer 118 is then grown by dry oxidation of the exposed portions of the silicon substrate. An oxide layer 116 is then deposited into the trench and across the surface of the structure by chemical vapor deposition (CVD). In FIG. 3(d) chemical-mechanical polishing (CMP) planarizes the surface, leaving the oxide layer 116 only in the trench. In FIG. 3(e) the silicon nitride and thermal oxide layers are removed, and a gate oxide layer 110 is grown on the silicon substrate.

In the STI process described above, silicon etching is usually performed by reactive ion etching (RIE), which may result in damage to the etched area. The damage may create defects, contamination and stress that may result in electrical degradation of the device, such as high leakage and low efficiency isolation performance.

Often the STI process will include thermal treatments such as thermal oxidation and annealing or densification to remove the defects. However, these treatments are frequently insufficient to obtain a damage-free silicon surface in the trench, and may lead to even greater damage at the lower corners of the trench oxide structures (e.g., dislocations in the surrounding silicon) due to greater thermal expansion of oxide relative to silicon. The upper corners of the trench (and the adjacent silicon) also experience problems resulting from a similar stress concentration, as well as an increased risk of electrical "leakage" from local electric field effects.

CVD of oxide into the trench may also exacerbate the defect problems, possibly by aggregating contamination from the oxide at the defects in the silicon surface during annealing or densification, and/or by bearing the stress from the silicon corners.

BRIEF SUMMARY OF THE INVENTION

In one aspect, the present invention concerns a process for making a semiconductor structure, including forming a dielectric layer on exposed regions of an intermediate structure. The intermediate structure includes (a) a semiconductor substrate having the regions, (b) a first dielectric layer, on at least a second region of the semiconductor substrate, (c) an etch-stop layer, on at least a portion of the dielectric layer, and (d) spacers on at least a third region of the semiconductor substrate. The spacers are adjacent edges of the etch-stop layer and adjacent the exposed regions.

In a second aspect, the present invention concerns a semiconductor structure, including: (i) a semiconductor substrate, (ii) field oxide regions on a first portion of the semiconductor substrate, and (iii) gate oxide regions on a second portion of the semiconductor substrate. The surface of the first portion of the semiconductor substrate does not contain reactive ion etch damage.

Definitions

A thick dielectric layer is a dielectric layer (for example, a silicon oxide layer or silicon nitride layer) that has a thickness greater than the thickness of a thin dielectric layer, and preferably has a thickness of 1000 to 50,000 Å, more preferably a thickness of 5000 to 10000 Å.

A thin dielectric layer is a dielectric layer (for example, a silicon oxide layer or silicon nitride layer) that has a thickness less than the thickness of a thick dielectric layer, and preferably has a thickness of 10 to 999 Å, more preferably a thickness of 100 to 250 Å.

The term "adjacent" means that there are no functional structures between the specified structures. A functional structure is a structure intentionally placed on the semiconductor device that affects the function of the device. For example, a functional structure may mean a structure having a predetermined set of dimensional and/or compositional parameter values, that has an electrical, mechanical and/or optical function (e.g., conductive, insulative, masking, photolithographic, antireflective).

The term "exposed regions" means regions of a structure that are not covered by another structure.

The term "planarizing" means to flatten, level or remove material, preferentially in the vertical direction, to enhance the planarity of the structure.

The term "reactive ion etch damage" means damage associated with reactive ion etching that can affect the performance of a semiconductor device containing such damaged areas.

The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorous or a mixture thereof; preferably $SiO_2$ or $SiO_2$ conventionally doped with 1–12 wt. % of phosphorous and 0–8 wt. % of boron).

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein:

FIG. 1 shows an edge-on view of a portion of a conventional semiconductor device containing field oxide formed by LOCOS;

FIG. 2 shows an edge-on view of a portion of a conventional semiconductor device containing field oxide formed by STI;

FIGS. 3(a)–3(e) illustrate a series of successive edge-on views for forming the structure of FIG. 2.

DETAILED DESCRIPTION OF THE INVENTION

With the present invention it is possible to form a damage-free semiconductor substrate in a trench, using a sacrificial layer. Wet chemical removal of the sacrificial layer prevents damage to the semiconductor substrate surface, in order to for a trench. The trench may then be filled to form a dielectric isolation structure. This eliminates the field oxide portion having the shape of a bird's beak, typical of conventional LOCOS.

Figure 4A:
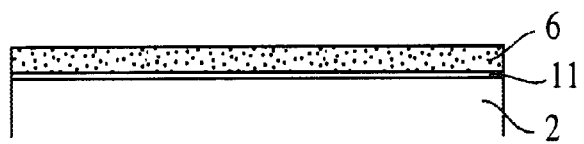
FIGS. 4(a)–4(d) and FIGS. 5(a)–5(e) illustrate a series of successive edge-on views for an embodiment of the present invention.
Figure 4B:
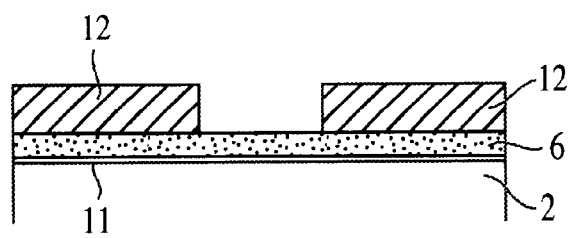

FIGS. 4(a)–4(d) illustrate a first portion of an embodiment of the invention. In FIG. 4(a), an etch-stop layer 6 covers a thin dielectric layer 11, which in turn covers a semiconductor substrate 2. Preferably, the semiconductor substrate is single crystal silicon, the dielectric layer is a thermally grown oxide layer, and the etch-stop layer is silicon nitride. More preferably, etch stop layer 6 comprises a silicon-rich silicon nitride having a refractive index of at least 2.1 and a thickness of from 500 to 3000 Å, even more preferably from 1500 to 2000 Å. In FIG. 4(b), a photoresist layer 12 is applied to the surface of the structure, and patterned.

Figure 4C:
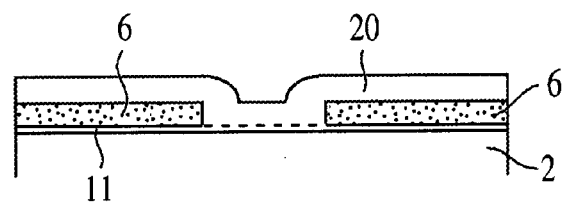

In FIG. 4(c), the exposed portions of the etch-stop layer (and optionally the thin dielectric layer) are removed. The photoresist layer is stripped and the surface cleaned. If the exposed portion of dielectric layer 11 was removed, a thin dielectric layer may be reformed or grown (preferably by dry thermal oxidation) on the exposed portion(s) of the semiconductor substrate 2, and may be contiguous with the remaining thin dielectric layer 11. Then a thick dielectric layer 20 is deposited over the surface. The thick dielectric layer is preferably an oxide deposited by CVD, more preferably by decomposition of TEOS, having a thickness of from 500 to 5000 Å, even more preferably from 1000 to 2500 Å.

Figure 4D:
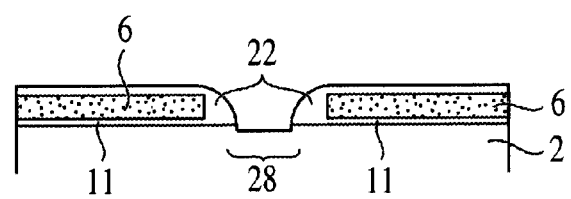

In FIG. 4(d) the thick dielectric layer 20 has been etched to make spacers 22 adjacent the edges of the etch-stop layer, and adjacent the newly exposed region 28 of the semiconductor substrate, which in one embodiment, has a width of from ½ to ¾ of the distance between the sidewall interface between the corresponding adjacent spacers 22 and etch stop layer structure(s) 6. In a more preferred embodiment, the width of region 28 is about ⅔ of the distance between the corresponding spacer-etch stop layer interfaces. Preferably, the spacers are in contact with the etch-stop layer and the exposed regions of the semiconductor substrate.

The spacers may inhibit or prevent defect introduction in subsequent steps of the process (e.g., a trench etch step, an oxide growth step, etc.). For example, the spacers enable one to etch a relatively narrow trench (compared to the method illustrated in FIGS. 3(a)–(e) for an isolation structure of approximately the same width) and grow the oxide for the isolation structure, rather than deposit it (e.g., by CVD). In addition, oxide grown in a subsequently formed trench may exhibit increased corner rounding relative to the method illustrated in FIGS. 3(a)–(e), thus reducing stress-induced defects and corner-induced transistor "leakage."

Optionally, and preferably, the exposed semiconductor substrate surface between the spacers may be etched to from a trench. Such a trench may have a depth the same as or less than a predetermined depth of the isolation structure 16 to be formed (see FIGS. 5(d) and 5(e)), preferably from about 5 to about 90% of the depth of the isolation structure, more preferably from about 25 to about 75% of the depth of the isolation structure.

Figure 5A:
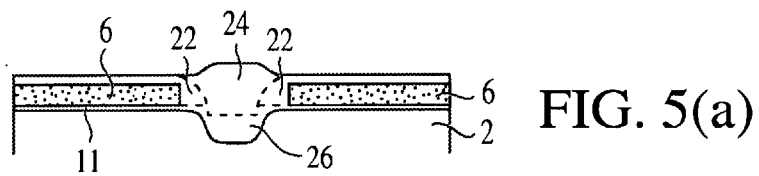

FIGS. 5(a)–5(e) illustrate a second portion of an embodiment of the invention. In FIG. 5(a), after cleaning, a (sacrificial) oxide structure 24/26 is grown on the exposed semiconductor substrate regions, preferably by conventional dry and/or wet thermal oxidation (more preferably a dry thermal oxidation step to form lower portion 26, followed by a wet thermal oxidation step to form upper portion 24). In its entirety, this oxide structure may comprise the spacers 22, and newly formed materials from oxidation of the substrate: a section below the spacers 26, and a section between and (optionally) above the spacers 24. In certain embodiments, section 26 has a depth of from 1500 to 8000 Å relative to the upper surface of the substrate 2 (i.e., that surface closest to etch stop layer 6), more preferably from 2000 to 5000 Å, and even more preferably from 3000 to 3500 Å; and a section 24 has a height of from 1000 to 5000 Å relative to the upper surface of the substrate 2, more preferably from 1500 to 3500 Å, and even more preferably from 2000 to 2500 Å.

Figure 5B:
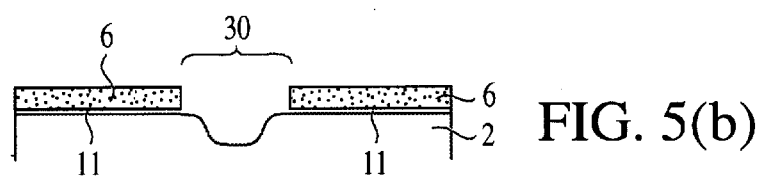
Figure 5C:
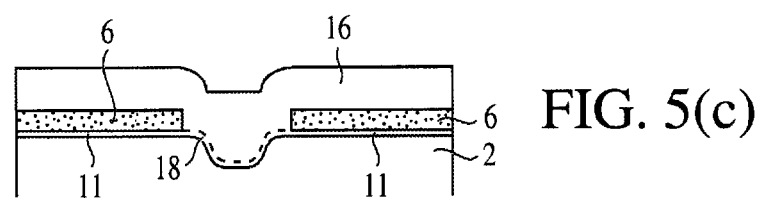

Optionally, as illustrated in FIGS. 5(b) and 5(c), the sacrificial oxide structure 24/26 may be removed and replaced. In FIG. 5(b), the sacrificial oxide structure 24/26 may be etched (for example with a conventional wet chemical etching process) to create trench 30. For example, the sacrificial layer could be etch with fluorine-based wet chemicals. When the etch-stop layer comprises silicon nitride and the sacrificial oxide structure comprises silicon dioxide, then buffered HF is preferred. FIG. 5(c) shows (an optional) thermal oxide layer 18 grown at the bottom of the trench, and a thick dielectric layer 16 deposited on the surface. Preferably, dielectric layer 16 comprises an oxide deposited by CVD.

Figure 5D:
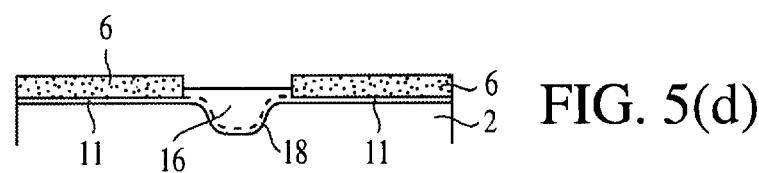
Figure 5E:
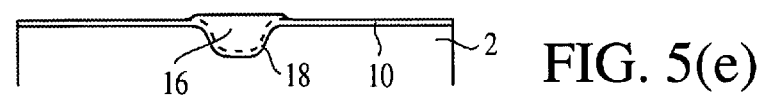

In FIG. 5(d), the surface of the semiconductor structure is planarized, preferably by CMP. Therefore, in one embodiment, the etch stop layer may also comprise a polish stop layer (which may be the same as or different from the etch stop layer; e.g., under conditions known to those of ordinary skill in the art, silicon nitride may provide both etch stop and chemical-mechanical polish stop functions). In FIG. 5(e), the etch-stop layer 6 (and optionally dielectric layer 11) is removed, and a gate dielectric layer 10 may be grown on the semiconductor substrate. Preferably, the gate dielectric layer is a gate oxide, grown thermally.

As noted above, the operations illustrated in FIGS. 5(b,) and 5(c) are optional. Other variations are also possible. For example, the process may be stopped at the point illustrated in FIG. 5(b), in order to provide a substrate with a trench that may be used to construct other semiconductor devices. Alternatively, if the compositional difference(s) between the grown oxide structure 22/24/26 and the desired trench oxide 16 are functionally insignificant, the process may simply comprise chemical-mechanical polishing a structure such as that shown in FIG. 5(a), in order to provide a dielectric for isolating regions of the semiconductor substrate.

The invention provides a semiconductor devices that may have higher reliability, and that may reduce manufacturing costs per device.

The individual processing steps for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; and Microchip Fabrication 3rd. edition, Peter Van Zant, McGraw-Hill, 1997. Conventional chemical-mechanical polishing is described in U.S. Pat. Nos. 4,789,648, 4,954,142 and 5,262,354.

The substrate may typically be a semiconductor material conventionally known by those of ordinary skill in the art. Examples include silicon, gallium arsenide, germanium, gallium nitride, aluminum phosphide, and alloys such as $Si_{1-x}Ge_x$ and $Al_xGa_{1-x}As$, where $0 \leq x \leq 1$. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

Any of the dielectric layers, and the etch-stop layer, may be made from a dielectric material conventionally known to those of ordinary skill in the art. Examples include conventional oxides, nitrides, oxynitrides, and other dielectrics, such as borophosphosilicate glass (BPSG), borosilicate glass (BSG), phosphosilicate glass, spin-on glass (SOG), silicon oxide, P-doped silicon oxide (P-glass), and silicon nitride. The dielectric layer must be made from a material that is different from the etch-stop layer.

The dielectric layer may be deposited by conventional methods known to those of ordinary skill in the art, such as by spin-on methods, sintering (which may further include sol-gel oxide formation), chemical vapor deposition, etc. A glass layer deposited by a chemical vapor deposition technique may be subject to a glass reflow step (e.g., by heating) to smooth, densify and further improve the contact between the protection layer and the substrate.

When a dielectric layer is to be etched, it is made from a material that can be etched more quickly than the etch-stop layer. If the dielectric layer is made from silicon oxide, or a glass, such as borophosphosilicate glass (BPSG), borosilicate glass (BSG), phosphosilicate glass, spin-on glass (SOG), or P-doped silicon oxide (P-glass), it may be doped in order to enhance the selectivity etching the glass or oxide instead of the etch-stop layer. Preferably, the etch selectivity (i.e., the ratio of (a) the rate of dielectric etching to (b) the rate of etch stop material etching) is at least 2:1, preferably at least 3:1, more preferably at least 5:1 and even more preferably at least 10:1. In the case of silicon oxide using silicon nitride as the etch-stop layer, an etching solution of one part HF (49%) in one part deionized water will give a selectivity of greater than 1:300.

The isolation structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc.

Etching of deposited films may be conducted by conventional methods known to those of ordinary skill in the art. The specific etching method and materials depend on the material being removed, the resist material and the compatibility of the etching material with the existing structure. Selection of suitable etching materials, resist materials and etching conditions is within the level of ordinary skill in the art.

Obviously, numerous modifications and variations of the present invention are possible in light of the above teachings. It is therefore to be understood that within the scope of the appended claims, the invention may be practiced otherwise than as specifically described herein.

What is claimed is:

1. A process for making a semiconductor structure, comprising:

forming a second dielectric layer on first exposed regions of an intermediate structure by oxidizing said intermediate structure: and planarizing said second dielectric layer;

wherein said intermediate structure comprises
   (a) a silicon semiconductor substrate having said first regions,
   (b) a first dielectric layer, on at least a second region of said semiconductor substrate,
   (c) an etch-stop layer, on at least a portion of said first dielectric layer, and
   (d) spacers, on a plurality of third regions of said semiconductor substrate, wherein said spacers are adjacent edges of said etch-stop layer and adjacent said first regions, and said planarizing comprises chemical-mechanical polishing.

2. The process of claim 1 wherein said first dielectric layer comprises a first oxide, and said spacers comprise a second oxide.

3. The process of claim 2, wherein said forming comprises oxidizing said semiconductor substrate.

4. The process of claim 2, further comprising removing said etch-stop layer.

5. The process of claim 2, wherein said spacers are formed by: depositing a third dielectric layer; and etching said third dielectric layer to form said spacers.

6. The process of claim 2, wherein the etch-stop layer is a polish stop layer for the chemical-mechanical polishing.

7. A method of making a semiconductor device, comprising: making a semiconductor structure by the process of claim 2; and forming a semiconductor device from said semiconductor structure.

8. A method of making a electrical device, comprising:

making a semiconductor device by the method of claim 7; and forming an electrical device comprising said semiconductor device.

9. A process for making a semiconductor structure, comprising:

forming a second dielectric layer on first exposed regions of an intermediate structure by oxidizing said intermediate structure; and planarizing said second dielectric layer;

wherein said intermediate structure comprises
   (a) a silicon semiconductor substrate having said first regions,
   (b) a first dielectric layer, on at least a second region of said semiconductor substrate,
   (c) an etch-stop layer, on at least a portion of said first dielectric layer, and
   (d) spacers, on a plurality of third regions of said semiconductor substrate, wherein said spacers are adjacent edges of said etch-stop layer and adjacent said first regions, the oxidizing of said intermediate structure comprises dry thermal oxidation followed by wet thermal oxidation, the first dielectric layer comprises a first oxide, and said spacers comprise a second oxide, and the planarizing comprises chemical-mechanical polishing.

10. The process of claim 9, wherein said forming comprises oxidizing said semiconductor substrate.

11. The process of claim 9, wherein said spacers are formed by:
 depositing a third dielectric layer; and
 etching said third dielectric layer to form said spacers.

12. The process of claim 9, wherein the etch-stop layer is a polish stop layer for the chemical mechanical polishing.

13. A method of making a semiconductor device, comprising: making a semiconductor structure by the process of claim 9; and forming a semiconductor device from said semiconductor structure.

14. A method of making a electrical device, comprising; making a semiconductor device by the method of claim 13; and
 forming an electrical device comprising said semiconductor device.

* * * * *